United States Patent [19]

Yamazaki et al.

[11] 4,363,990
[45] Dec. 14, 1982

[54] SURFACE ACOUSTIC WAVE TRANSDUCER

[75] Inventors: Osamu Yamazaki, Suita; Junichi Inohara, Katano; Kazuo Tazuke; Kiyotaka Wasa, both of Nara, all of Japan

[73] Assignee: Matsushita Electric Industrial Co., Ltd., Kadoma, Japan

[21] Appl. No.: 212,685

[22] Filed: Dec. 3, 1980

[30] Foreign Application Priority Data

Dec. 13, 1979 [JP] Japan ................. 54-162454

[51] Int. Cl.³ ............................. H01L 41/08
[52] U.S. Cl. ............................. 310/313 C; 333/154; 333/196
[58] Field of Search ........... 310/313 R, 313 B, 313 C; 333/154, 193, 196

[56] References Cited

U.S. PATENT DOCUMENTS 3,676,721  7/1972  Van Den Heuvel et al. ... 333/154 X
3,760,204  9/1973  Yester, Jr. .................. 310/313 B

FOREIGN PATENT DOCUMENTS 54-12542  1/1979  Japan ............................ 310/313 C
55-49016  4/1980  Japan ............................ 310/313 C Primary Examiner—William M. Shoop
Assistant Examiner—Peter S. Wong
Attorney, Agent, or Firm—Wenderoth, Lind & Ponack

[57] ABSTRACT

A surface acoustic wave transducer having a piezoelectric thin film, interdigital electrodes disposed on one side surface of said piezoelectric thin film and an apodized counter electrode disposed on the opposite-side surface of said piezoelectric thin film. The outline of the apodized counter electrode is composed of parallel edges parallel to fingers of the interdigital electrode and perpendicular edges perpendicular to the fingers. The parallel edges are positioned in gaps between the fingers, so as not to lie over the fingers. Such structure remarkably reduces the deviation of characteristics of the transducer due to the incomplete alignment of the counter electrode with the interdigital electrode.

4 Claims, 2 Drawing Figures

SURFACE ACOUSTIC WAVE TRANSDUCER

BACKGROUND OF THE INVENTION

This invention relates to a surface acoustic wave transducer, and more particularly pertains to such transducer which includes an apodized counter electrode of an improved configuration.

FIG. 1 illustrates a typical example of the conventional surface acoustic wave transducers employing a piezoelectric thin film. On a non-piezoelectric substrate 1 such as glass, is deposited interdigital electrodes 2 of a vacuum evaporated Al which is shaped by a photolithography. A piezoelectric thin film 3 is laid over on the interdigital electrodes 2. On the piezoelectric thin film 3 is provided a counter electrode 4 which has an outline of a form corresponding to a desired apodized function.

The counter electrode 4 is made of a vacuum evaporated Al and is shaped by the photolithography process. In the photolithography process therefor, it is necessary to precisely align a mask for forming the counter electrode 4 with the interdigital electrodes 2.

However, it has been difficult to perform such mask-alignment always with sufficient precision in a manufacturing process. The incomplete mask-alignment causes the dispersion of the relative location between the interdigital electrodes 2 and the counter electrode 4, resulting in dispersion of the amplitude characteristic and the phase characteristic of the manufactured surface acoustic wave transducer.

SUMMARY OF THE INVENTION

It is an object of this invention to provide an improved surface acoustic wave transducer which can be manufactured with high stability of characteristics.

According to the present invention, a surface acoustic wave transducer comprises a piezoelectric thin film, an interdigital electrode disposed on one side of said piezoelectric thin film and a counter electrode disposed on the opposite side of said piezoelectric thin film, in which said counter electrode includes one or more separate parts and the outline of each part is composed of parallel edges parallel to fingers of said interdigital electrode and perpendicular edges perpendicular to said fingers. Those parallel edges being positioned so as not to lie over the fingers of the interdigital electrode.

DETAILED DESCRIPTION OF THE INVENTION

Figure 1:
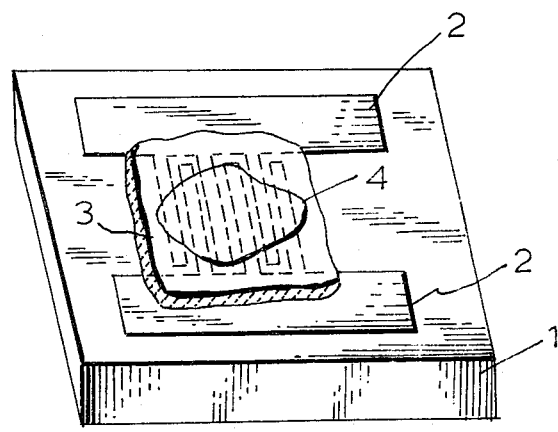
FIG. 1 is a perspective view of a conventional surface acoustic wave transducer.
Figure 2:
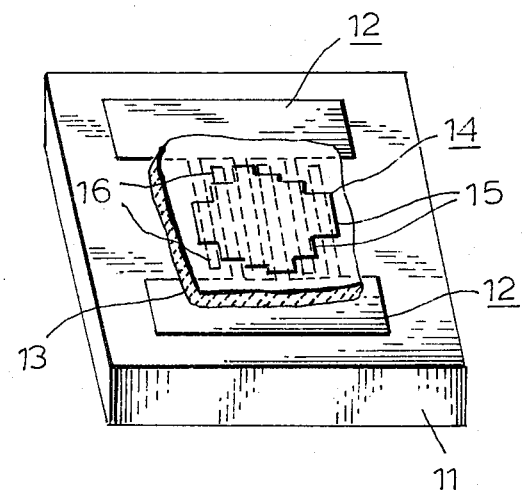
FIG. 2 is a perspective view of a surface acoustic wave transducer according to the present invention.

Referring to FIG. 2, there is shown an embodiment of the present invention, in which a substrate 11, interdigital electrodes 12 and a piezoelectric thin film 13 are constructed similarly to the conventional device shown in FIG. 1. The piezoelectric thin film 13 may be made of a suitable material such as ZnO, CdS, LiNbO$_3$ and Bi$_{12}$GeO$_{20}$ crystal. On the piezoelectric thin film 13 is disposed a counter electrode 14 which has an outline of steps configuration. That is, the outline is composed of parallel edges 15 parallel to fingers 16 of the counter electrodes 14 and perpendicular edges 17 perpendicular to the fingers 16. The parallel edges 15 are located in gaps between the fingers 16 and so the perpendicular edges 17 are located across the fingers 16.

In this structure, the deviation of the location of the counter electrode 14 does not so much affect the characteristics of the transducer, as long as the parallel edges 15 does not lie on the fingers 16. Therefore not so high precision is required in aligning the mask for forming the counter electrode 14 with the interdigital electrodes 12.

According to the invention, if the parallel edges 15 are designed to be located in a middle of two fingers having the polarity opposite to each other, the influence of the deviation of the mask-alignment on the characteristics can be negligible when the deviation is within one eighth of wavelength in case of solid fingers or within one sixteenth of wavelength in case of splitted fingers.

It is more effective when the thickness of the piezoelectric thin film is from 1 to 10% of wavelength of needed surface acoustic wave. The reason is considered as follows:

(i) When the film thickness is below 1% of the wavelength, a piezoelectric electromechanical coupling coefficient is not sufficiently large; and (ii) When the film thickness is above 10% of the wavelength, it is difficult to appropriately design the counter electrode due to an unequal distribution of electrical field between the fingers of the interdigital electrodes and the counter electrode.

Instead of the structure of the above-mentioned embodiment, it is possible to exchange the positions of the interdigital electrodes with that of the counter electrode, i.e., the counter electrode may be located beneath the piezoelectric film and the interdigiral electrode on the film.

The counter electrode may be divided into two or more parts without affecting the performance of the transducer such as frequency characteristics.

As described above, this invention provides a novel structure of a surface acoustic wave transducer comprising a piezoelectric thin film and improves the yield of production.

What is claimed is:

1. A surface acoustic wave transducer having a piezoelectric thin film, interdigital electrodes disposed on one side surface of said piezoelectric thin film and an apodized counter electrode disposed on the opposite-side surface of said piezoelectric thin film, wherein
said counter electrode has the outline composed of parallel edges parallel to fingers of said interdigital electrode and perpendicular edges perpendicular to said fingers, the parallel edges being positioned in gaps between said fingers, so as not to lie over said fingers of the interdigital electrode.

2. A surface acoustic wave transducer as claimed in claim 1, in which the thickness of said piezoelectric thin film is from 1 to 10% of wave length of required surface acoustic wave.

3. A surface acoustic wave transducer as claimed in claim 1, in which said parallel edges of the electrode are located in a middle of two fingers having polarities opposite to each other.

4. A surface acoustic wave transducer as claimed in claim 1, in which said counter electrode is divided into two or more parts.

* * * * *